US009570049B2

(12) United States Patent
Saito et al.

(10) Patent No.: US 9,570,049 B2
(45) Date of Patent: Feb. 14, 2017

(54) SEMICONDUCTOR DEVICE

(71) Applicant: Synaptics Japan GK, Tokyo (JP)

(72) Inventors: Satoshi Saito, Tokyo (JP); Takeshi Naruse, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 66 days.

(21) Appl. No.: 14/618,612

(22) Filed: Feb. 10, 2015

(65) Prior Publication Data

US 2015/0228251 A1 Aug. 13, 2015

(30) Foreign Application Priority Data

Feb. 10, 2014 (JP) ................................ 2014-023201

(51) Int. Cl.
*G09G 5/18* (2006.01)
*G09G 3/36* (2006.01)
*H03K 3/012* (2006.01)

(52) U.S. Cl.
CPC .............. *G09G 5/18* (2013.01); *G09G 3/3696* (2013.01); *G09G 2330/026* (2013.01); *G09G 2330/027* (2013.01)

(58) Field of Classification Search
None
See application file for complete search history.

(56) References Cited

U.S. PATENT DOCUMENTS

2004/0070580 A1* 4/2004 Minami ............... G09G 3/3674 345/204
2013/0050176 A1* 2/2013 Kim ......................... G09G 3/36 345/214
2014/0340382 A1* 11/2014 Sawabe ................ G09G 3/3696 345/212
2014/0347348 A1* 11/2014 Ijima .................... G09G 3/3685 345/213
2015/0213775 A1* 7/2015 Lee ...................... G09G 3/3688 345/212
2015/0269900 A1* 9/2015 Iwamoto .............. G09G 3/3648 345/100

FOREIGN PATENT DOCUMENTS

JP H05-107837 A 4/1993

* cited by examiner

*Primary Examiner* — Joseph Haley
*Assistant Examiner* — Emily Frank
(74) *Attorney, Agent, or Firm* — Patterson + Sheridan, LLP

(57) ABSTRACT

The semiconductor device includes: a select circuit which selects, from output signals of tiding generators, timing signals formed by one timing generator; another select circuit which is disposed in a stage after the select circuit, and selects the tiding signals selected by the first select circuit or signals regulated in polarity, and outputs the selected signals outward; and a control register provided for variably setting the polarities of the signals regulated in polarity in units of the signals. If abnormal power supply cutoff of the semiconductor device is detected, the second select circuit is switched from the state of selecting the timing signals to the state of selecting the signals regulated in polarity in response to the detection.

12 Claims, 9 Drawing Sheets

SEMICONDUCTOR DEVICE

CROSS-REFERENCE TO RELATED APPLICATIONS

The Present application claims priority from Japanese application JP 2014-023201 filed on Feb. 10, 2014, the content of which is hereby incorporated by reference into this application.

BACKGROUND

Field of the Disclosure

The invention relates to a technique for allowing a timing generation logic to adapt to an abnormal power supply cutoff, an undesired reset instruction and the like which take place in the course of drive control and for example, a technique useful in application to a liquid crystal driver which pet forms an abnormal shutdown process.

Description of the Related Art

To stabilize a restart process after power supply recovery by means of an exceptional process different from a normal shutdown sequence with undesired power supply cutoff caused is necessary for not only a cooler as disclosed by the Japanese Unexamined Patent Publication No. JP-A-5-107837, but also many devices.

For instance, in case that an undesired power supply cutoff takes place owing to battery falling or the like during display driving in a liquid crystal driver operable to control, in display, a liquid crystal display panel incorporated in e.g. a personal digital assistant using a battery power supply, the liquid crystal display panel is in danger of suffering the degradation of characteristics. This is because in such a case, the liquid crystal driver cannot go through a normal power supply cutoff sequence and thus, the timing control to the liquid crystal display panel becomes unstable, and the display operation is stopped with undesired voltages remaining applied to display pixels. To eliminate such a danger, an exceptional process may be adopted; in the exceptional process, the polarities or timing signals to be supplied to the liquid crystal display panel are fixed to predetermined levels by use of a remaining capacity of the power supply at occurrence of the undesired power supply cutoff.

Now, it is noted that such an exceptional process is disclosed by JP-A-5-107837.

SUMMARY

A semiconductor device for forming drive signals and outputting the drive signals in parallel is provided herein. The semiconductor device includes a first select circuit configured to select, from output signals of a plurality of timing generators that includes a timing generator configured to output timing signals of more than one bit according to a predetermined sequence, timing signals formed by one timing generator. The semiconductor device also includes a second select circuit configured to select either the timing signals selected by the first select circuit or signals regulated in polarity, and to output the selected signals. The semiconductor device further includes a control register configured to variably set, in units of the signals, the polarities of the signals regulated in polarity. The semiconductor device also includes a detection circuit configured to detect an abnormal power supply cutoff of the semiconductor device. In response to detection of an abnormal power supply cutoff by the detection circuit, the second select circuit is configured to switch from a state of selecting the timing signals to a state of selecting the signals regulated in polarity.

ft semiconductor device is also provided. The semiconductor device includes a timing control part configured to output timing signals of more than one bit formed by a timing generator of a plurality of timing generators. The semiconductor device also includes a drive control part configured to font drive signals in synchronization with the timing control part, and to output the drive signals. The timing control part includes a first select circuit configured to select, from output signals of the timing generators, timing signals formed by one timing generator. The timing control part also includes a second select circuit configured to select either the timing signals selected by the first select circuit, or signals regulated in polarity, and to output the selected signals. The timing control pert further includes a control register configured to variably set, in units of the signals, the polarities or the signals regulated in polarity. The timing control part also includes a detection circuit configured to detect a predetermined abnormal condition during an operation period of the drive control part for outputting the drive signals, the second select circuit is configured to switched from a state of selecting the timing signals to a state of selecting the signals regulated in polarity in response to detection of the abnormal condition by the detection circuit.

A method is also provided. The method includes outputting timing signals of more than one bit formed by a timing generator of a plurality of timing control generators of a timing control part. The method also includes forming drive signals in synchronization with the timing control part, by a drive control part. The method further includes selecting from output signals of the timing generators, timing signals formed by one timing generator. The method also includes selecting and outputting either the selected timing signals or signals regulated in polarity. The method further includes setting the polarities of the signals regulated in polarity, based on a control register. The method also includes detecting a predetermined abnormal condition during an operation period or the drive control part for outputting the drive signals. Selecting and outputting either the selected timing signals or signals regulated in polarity in done in response to detecting the predetermined abnormal condition.

DETAILED DESCRIPTION

Introduction

Figure 1:
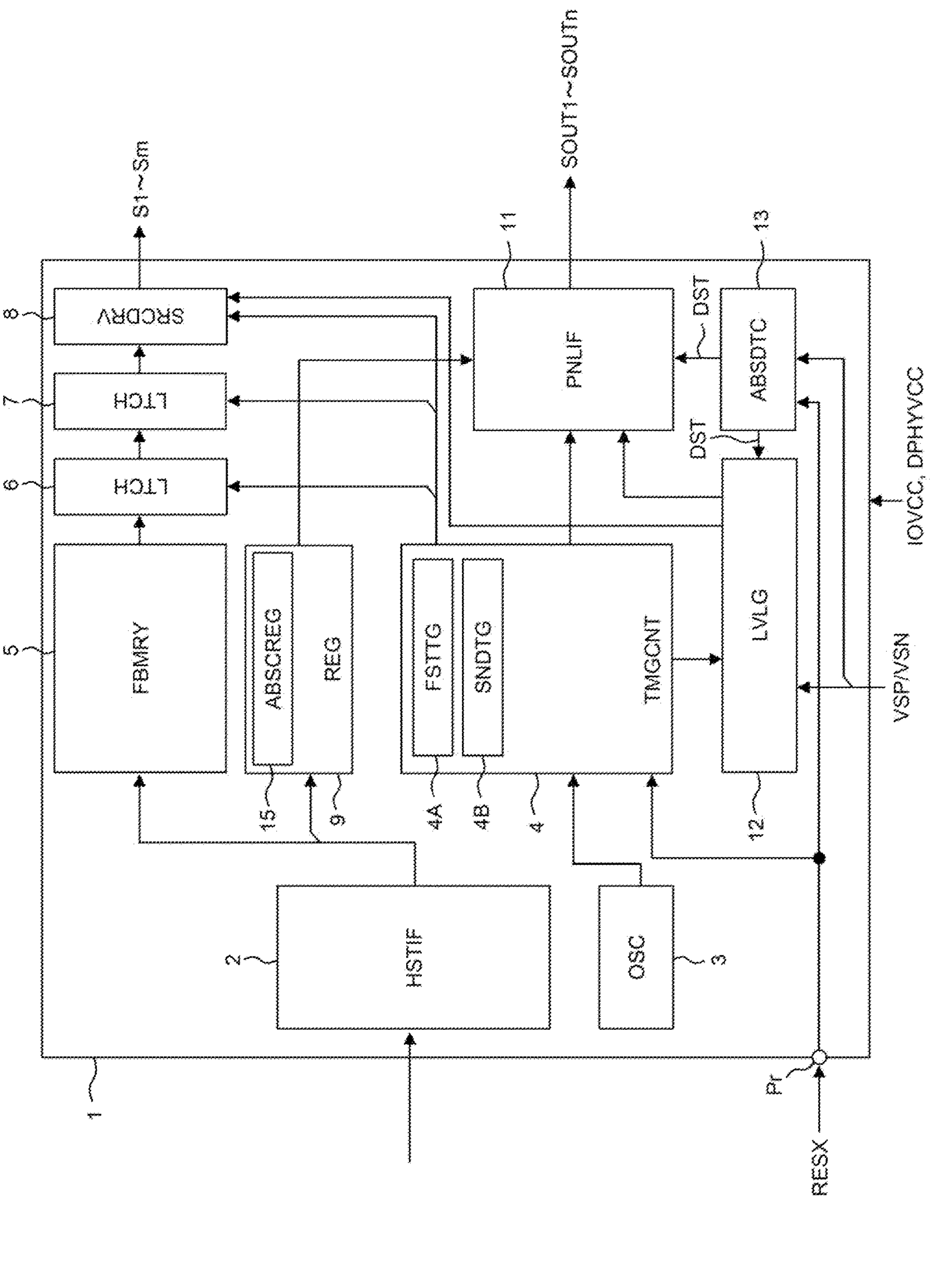
FIG. 1 is a block diagram showing, by example a liquid crystal driver in connection with one embodiment or a semiconductor device.

The control timing or control wavelength of a liquid crystal display panel varies depending on the manufacturer of the liquid crystal display panel, and the product type thereof. Therefore, having a timing generation logic including timing generators capable of forming timing signals adaptive to liquid crystal display panels of manufacturers which are expected to be used in advance, it is possible to adapt to the liquid crystal display panels by selecting and using one of the timing generators. In such a case, the pattern of fixing timing signal polarity on more than one timing signal at the time of occurrence of undesired power supply cutoff changes depending on the manufacturer of a liquid crystal display panel concerned, etc. Factoring in this fact, it becomes necessary to previously provide a circuit for deciding the polarity of more than one timing signal for each timing generator to be incorporated in a device concerned at the time of occurrence of an undesired power supply cutoff.

However, there is a tendency for a process against an undesired power supply cutoff to change depending on not only manufacturers of liquid crystal display panels, but also what products the liquid crystal display panels are commercialized into because of sophistication and diversification Of the liquid crystal display panels. Under circumstances in which the number of timing generators to be incorporated is already large, if it becomes necessary to provide a circuit for deciding the polarities of timing signals for each timing generator, the problems of the rise in circuit scale, the upsizing of chip footprint, and the rise in logic verification cost crop up.

Of the embodiments in this application, the representative embodiment will be briefly outlined below.

The semiconductor device includes: a select circuit which selects, from output signals of timing generators, timing signals formed by one timing generator; another select circuit which is disposed in a stage after the select circuit, and selects timing signals selected by one first select circuit or signals regulated in polarity and outputs the timing signals thus selected to the outside; and a control register which variably sets the polarities of the signals regulated in polarity in units of signals. The semiconductor device is arranged so that if abnormal power supply cutoff thereof is detected, the second select circuit is switched frost the state of selecting the timing signals to the state of selecting the signals regulated in polarity in response to the detection.

The effect achieved by the representative embodiment of the embodiments in this application will be briefly described below.

The problems of the circuit scale enlargement, the upsizing of a chip footprint, and the rise in logic verification cost can be solved without the need for independently providing circuits which regulate, as desired, the polarities of timing signals output by the timing generators, one for each timing generator for the process of taking a measure against an abnormal power supply cutoff or the like.

1. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

[1] Making Programmable Signal Polarities Which are Switched in Response to Abnormal Power Supply Cutoff A semiconductor device (1) forms drive signals (S1 to Sm) and outputs the drive signals outward and in parallel, outputs timing signals of more than one bit formed by one of timing generators (20 to 23) outward according to a predetermined sequence. The semiconductor device has: a first select circuit (30) which selects, from output signals of the timing generators, timing signals formed by one timing generator; a second select circuit (32) which selects the timing signals selected by the first select circuit or signals regulated in polarity, and outputs the selected signals outward; a control register (15) which variably sets, in units of the signals, the polarities of the signals regulated in polarity; and a detection circuit (13) which detects an abnormal power supply cutoff of the semiconductor device. In response of detection of an abnormal power supply cutoff by the detection circuit, the second select circuit is switched from a state of selecting the timing signals to a state of selecting the signals regulated in polarity.

According to the embodiment like this, it is not required to independently provide circuits which regulate, as desired, the polarities of timing signals output by timing generators, one for each timing generator for the process of taking a measure against an abnormal power supply cutoff or the like. Therefore, the problems of the rise in circuit scale, the upsizing of chip footprint, and the rise in logic verification cost can be solved. In addition, signal polarities can be variably set on the control register in units of signals and therefore, it is possible to flexibly adapt to the change in specifications for the polarities to be fixed.

[2] Power Supply Cutoff During an Operation Period for Outputting Drive Signals Outward In the semi conduct ac device as stated, in [1]the abnormal power supply cutoff is an abnormal drop in source voltage as a deviation from a power supply cutoff sequence is caused.

The embodiment like this can contribute toward keeping stabilization in a device to he controlled even against an abnormal drop in source voltage as a deviation from the power supply cutoff sequence is caused.

[3] Regarding a Reset Instruction as an Abnormality Power Supply Cutoff During an Operation Period for Outputting Drive Signals Outward In the semiconductor device as stated in [1], even if the detection circuit detects a reset instruction during an operation period for output ting the drive signals outward, the abnormal power supply cutoff is regarded as taking place.

The embodiment like this can contribute toward keeping stabilization in a device to be controlled even if in is required to reset the device in the middle of drive control.

[4] Application to a Display Driver

In the semiconductor device as stated in [1], the drive signals are display signals which drive a display panel in units of display frames, and the timing signals are display timing signals of the display panel.

According to the embodiment like this, it becomes possible to take a measure against an abnormal power supply cutoff according to various display panels different in manufacturer and/or product type by use of one semiconductor device.

[5] Host Interface Circuit

The semiconductor device as stated in [1] further has a host interface circuit (2) which allows the control register to be accessed from outside the semiconductor device.

According to the embodiment like this, it is possible to set appropriate data on the control register from outside even in the case of the semiconductor device having no processor, for example.

[6] Making Programmable Signal Polarities Which are Switched in Response to an Abnormal Condition The semiconductor device has: a timing control part (4A, 11, 13, 15) which outputs timing signals of more than one bit formed by one of timing generators outward; and a drive control part (4B, 5, 6, 7, 8) which forms drive signals (S1 to Sm) in synchronization with the timing control part, and outputs the drive signals outward. The timing control part has: a first select circuit (30) which selects, from output signals of the timing generators, timing signals formed by one timing generator; a second select circuit (32) which selects the timing signals selected by the first select circuit, or signals regulated in polarity, and outputs the selected signals outward; a control register (15) which variably sets, in units of the signals, the polarities of the signals regulated in polarity; and a detection circuit (13) which detects a predetermined abnormal condition during an operation period of the drive control part for outputting the drive signals. The second select circuit is switched from a state of selecting the timing signals to a state of selecting the signals regulated in polarity in response to detection of the abnormal condition by the detection circuit.

According to the embodiment like this, it is not required to independently provide circuits which regulate, as desired, the polarities of timing signals output by timing generators, one for each timing generator for the process of hating a measure against a predetermined abnormal condition. Therefore, the problems of the rise in circuit scale, the upsizing of chip footprint, and the rise in logic verification cost can be solved. In addition, it is possible to flexibly adapt to the change in specifications for the polarities to be fixed. This is because signal polarities can be variably set on the control register in units of signals.

[7] Abnormal Fluctuation of Source Voltage

In the semiconductor device as stated in [6], the predetermined abnormal condition is an abnormal fluctuation in source voltage.

The embodiment like this can contribute toward keeping stabilization of a device to be controlled even against an abnormal power supply cutoff as a deviation from the power supply cutoff sequence is caused.

[8] Reset Instruction at an External-Reset Terminal

In the semiconductor device as stated in [6], the predetermined abnormal condition is a condition in which a reset instruction is accepted at an external-reset terminal (Pr) of the semiconductor device.

The embodiment like this can contribute toward keeping stabilizing a device to be controlled even if it is regained to reset the device in the middle of drive control.

[9] Application to a Display Driver

In the semiconductor device as stated, in [6], the drive signals are display signals which drive a display panel in units of display frames, and the timing signals are display timing signals of the display panel.

According to the embodiment like this, it becomes possible to take a measure against an abnormal power supply cutoff or the like according to various display panels different in manufacturer and/or product type by use of one semiconductor device.

[10] Host Interface Circuit

The semiconductor device as stated, in [6] further has a host interface circuit (2) which allows the control register to he accessed from outside the semiconductor device.

According to the embodiment like this, it is possible to set appropriate data on the control register from outside even in the case of the semiconductor device having no processor, for example.

2. Further Detailed Description of the Embodiments

Now, the embodiments will be further described in detail.

Liquid Crystal Driver

Referring to FIG. 1, a liquid crystal driver in connection with one embodiment of the semiconductor device is shown by example. Although no special restriction is intended, the liquid crystal driver 1 shown in FIG. 1 is formed on a substrate of a semiconductor such as monocrystalline silicon by CMOS integrated circuit manufacturing technique and the like.

Although no special restriction is intended, the liquid crystal driver 1 has: a host interface circuit (HSTIF) 2 which is connected to a processor such as a host processor according to the specifications of an interface such as MiPi (Mobile Industry Processor Interface); an oscillation circuit (OSC) 3 which produces operation clock signals of the liquid crystal driver 1; a timing control circuit (TMGCNT) 4; a frame buffer memory (FBMRY) 5; a line latch circuit (LTCH) 6; a line latch circuit (LTCH) 7; a source driver (SRCDRV) 8; a register circuit (CREG) 9; a panel interface circuit (PNLIF) 11; a drive voltage generation circuit (LVLG) 12; and an abnormality detection circuit (ABSDTC) 13.

The dost interface circuit 2 is supplied with commands, control data and image data from the host processor (not shown). The commands thus supplied are input to a command register (not shown) of the register circuit 9, and the internal parts of the liquid crystal driver 1 are controlled based on the input commands. The timing control circuit 4 produces timing signals used for such control based on the commands and control data.

The input image data are stored in the frame buffer memory 5. The image data thus stored are transmitted in units of display lines from the frame buffer memory 5 to the line latch circuits 6 and 7 in turn in synchronization with a horizontal display timing inside the liquid crystal driver 1. The source driver 8 outputs source drive signals S1 to Sm having gradation voltages according to the data internally transmitted in units of display lines to a liquid crystal display panel (not shown in the drawing). The gradation voltages are generated by the drive voltage generation circuit 12 on receipt of external analog voltages VSP and VSN. For instance, the voltage VSP is +5 V, and the voltage VSN is −5 V. A source voltage for another logic is denoted by DPHYVCC, and a source voltage for an external interface is denoted by IOVCC, in the diagram.

The timing control circuit 4 has a first timing generation logic (FSTTG) 4A for producing timing signals for controlling the internal pares of the liquid crystal driver 1 based on commands and control data as described above, and a second timing generation logic (SNDTG) 4B for producing timing signals necessary for a display operation by the liquid crystal display panel which is not shown in the diagram. Timing signals produced by the second timing generation logic 4B are output as timing signals SOUT1 to SOUTn through the panel interface circuit 11 to the liquid crystal display panel (not shown).

The control timing or control wavelength of the liquid crystal display panel varies depending on the manufacturer of the liquid crystal display panel and the product type thereof. Therefore, the timing control circuit 4 is arranged to have the second timing generation logic 4B including more than one timing generator capable of forming timing signals adaptive to liquid crystal display panels of manufacturers which are expected to be used in advance. By selecting and using one timing generator from the more than one timing generator, the timing control circuit 4 can handle the lipoid crystal display panels.

In FIG. 1, RESX represents a reset signal supplied to an external-reset terminal Pr, which is shown representatively and supplied to the timing control circuit 4 and the abnormality detection circuit 13.

The abnormality detection circuit 13 makes a judgment on whether the power supply is cutoff or a reset instruction is issued during display operation, and provides a signal DST as a result of the judgment to the panel interface circuit 11 and the drive voltage generation circuit 12. If the power supply cutoff or a reset instruction during display operation is detected, the panel interface circuit 11 and the drive voltage generation circuit 12 perform actions for an abnormal shutdown (ABS) process. As the abnormal shutdown process, the panel interface circuit 11 adjusts timing signals SOUT1 to SOUTn to have the polarity depending on the liquid crystal display panel, thereby preventing an undesired charge resulting in the degradation of the liquid crystal display panel from remaining on a display pixel thereof in abnormal power supply cutoff. The drive voltage generation circuit 12 performs, as the abnormal shutdown process, an internal power supply process required for protecting an internal circuit of the liquid crystal driver. A reset instruction dinting display operation owing to noise or the like involves power supply cutoff by reset and therefore, the abnormal shutdown process comparable to the process to conduct at occurrence of the abnormal power supply cutoff will be performed. Now, it is noted that in a situation to conduct the abnormal shutdown process under, the abnormal power supply cutoff or reset instruction is also detected on a display system and the operation power supplies to the liquid crystal driver 1 tress the outside are stopped until the restart thereof.

The detail of the abnormal shutdown process will be described below.

Figure 2:
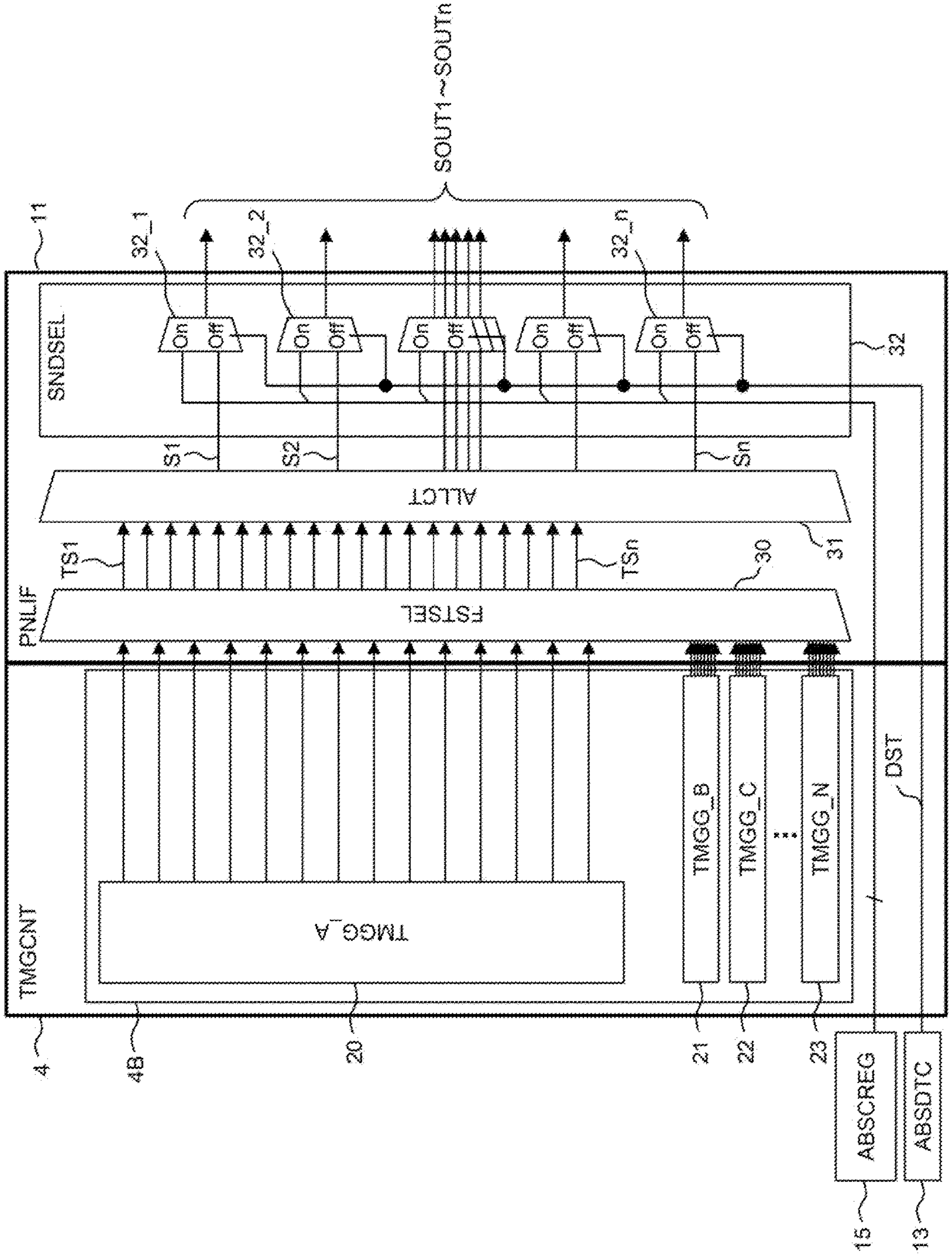
FIG. 2 is a block diagram showing a specific embodiment of the circuit arrangement of a second timing generation logic of a timing control part and a panel interface circuit.

Measure for Liquid Crystal Display Panels Different in Timing Specifications, and Abnormal Shutdown Process Referring to FIG. 2, a specific embodiment of the circuit arrangement of the second timing generation logic 4B of the timing control circuit 4, and the panel interface circuit 11 are shown.

The second timing generation logic 4B has timing generators (TMGG_A to TMGG_N) 20 to 23 as a signal-producing logic capable of forming timing signals adaptive to liquid crystal display panels of manufacturers which are expected to be used in advance. The timing generators 20 to 23 each have up to 32 outputs, for example.

The panel interface circuit 11 has: a first select circuit (FSTSEL) 30 which selects, from output signals of the timing generators 20 to 23, timing signals formed by one timing generator; an allocate circuit (ALLOT) 31 which limits and provides the output terminals SOUT1 no SOUTn with an array of timing signals selected by the first select circuit 30 according to the respective liquid crystal panel operation modes; and a second select circuit (SNDSEL) 32 which selects timing signals output by the allocate circuit 31, or signals regulated in polarity, and outputs the selected signals to the outside.

Although no special restriction is intended, the selection by the first select circuit 30 is performed according to control data set on a predetermined control register of the register circuit 9; the predetermined control register is not shown in the diagram. The number of outputs of the first select circuit 30 is up to 32 regardless of the number of the selected input timing signals. Signals output to the allocate circuit 31 consist of 32 timing signals TS1 to TSn and therefore, n=32 is assumed in the description below.

The second select circuit 32 has 32 two-input type selectors 32_1 to 32_n. Timing signals S1 to Sn of corresponding ordinal bit numbers are entered info one input of the selectors 32_1 to 32_n (on the side labeled with "off") from the allocate circuit 31, whereas contents of corresponding ordinal bit numbers of the polarity-set register (ABSCREG) 15 are entered info the other inputs (on the side labeled with "on") respectively.

The selectors 32_1 to 32_n receive, at select terminals, signals DST resulting from the judgment by the abnormality detection circuit 13. If no power supply cutoff nor reset instruction during display operation is caused, the selectors 32_1 to 32_n output, as the timing signals SOUT1 to SOUTn, timing signals TS1 to TSn produced by the second timing generation logic 4B. If power supply cutoff or a reset instruction during display operation is caused, the selectors 32_1 to 32_n output timing signals SOUT1 to SOUTn whose corresponding bit values are limited by values of the polarity-set register 15. The polarity-set register 15 is a part of control registers provided in the register circuit 9, and it can he overwritten according to program control by the host processor through the host interface circuit 2. Data held by the polarity-set register can be changed in units of bits. The data held by the polarity-set register 15 are used to limit, in polarity, the timing signals SOUT1 to SOUTn depending on the liquid crystal display panel in an abnormal shutdown process.

Therefore, in the case of selecting and using a proper timing generator from the timing generators 20 to 23 held by the second timing generation logic according to the liquid crystal display panel to be controlled in display by the liquid crystal driver 1, the polarities of timing signals SOUT1 to SOUTn required in the abnormal shutdown process are optimized by data written in the polarity-set register 15 according to the liquid crystal display panel to be driven. It is possible to adapt even to the case of using any one of the timing generators 20 to 23 by overwriting data of the polarity-set register 15.

Figure 3:
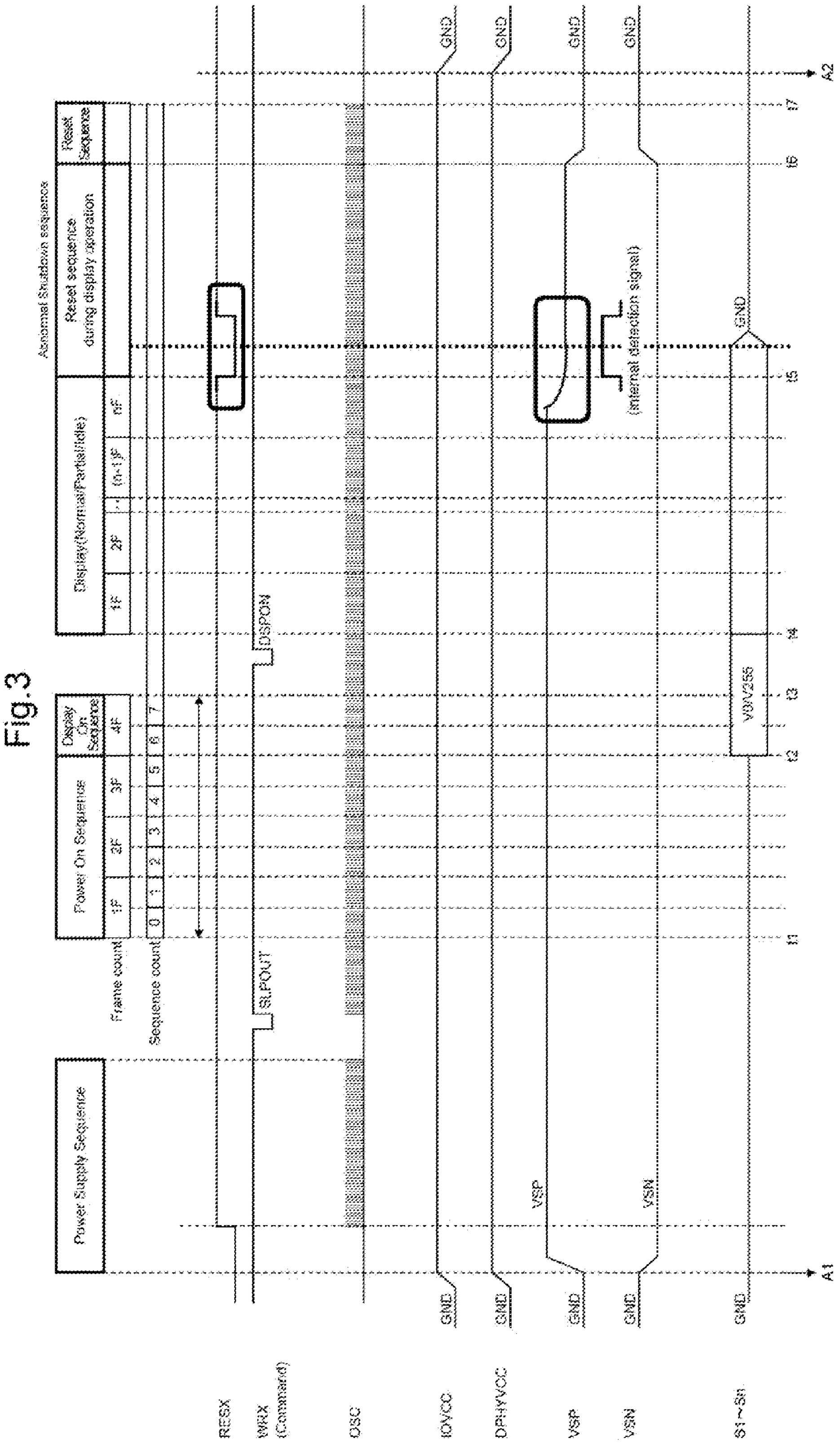
FIG. 3 is a timing diagram showing the first embodiment of the display operation timing in a case where an abnormal shutdown process interrupts a display operation.
Figure 4:
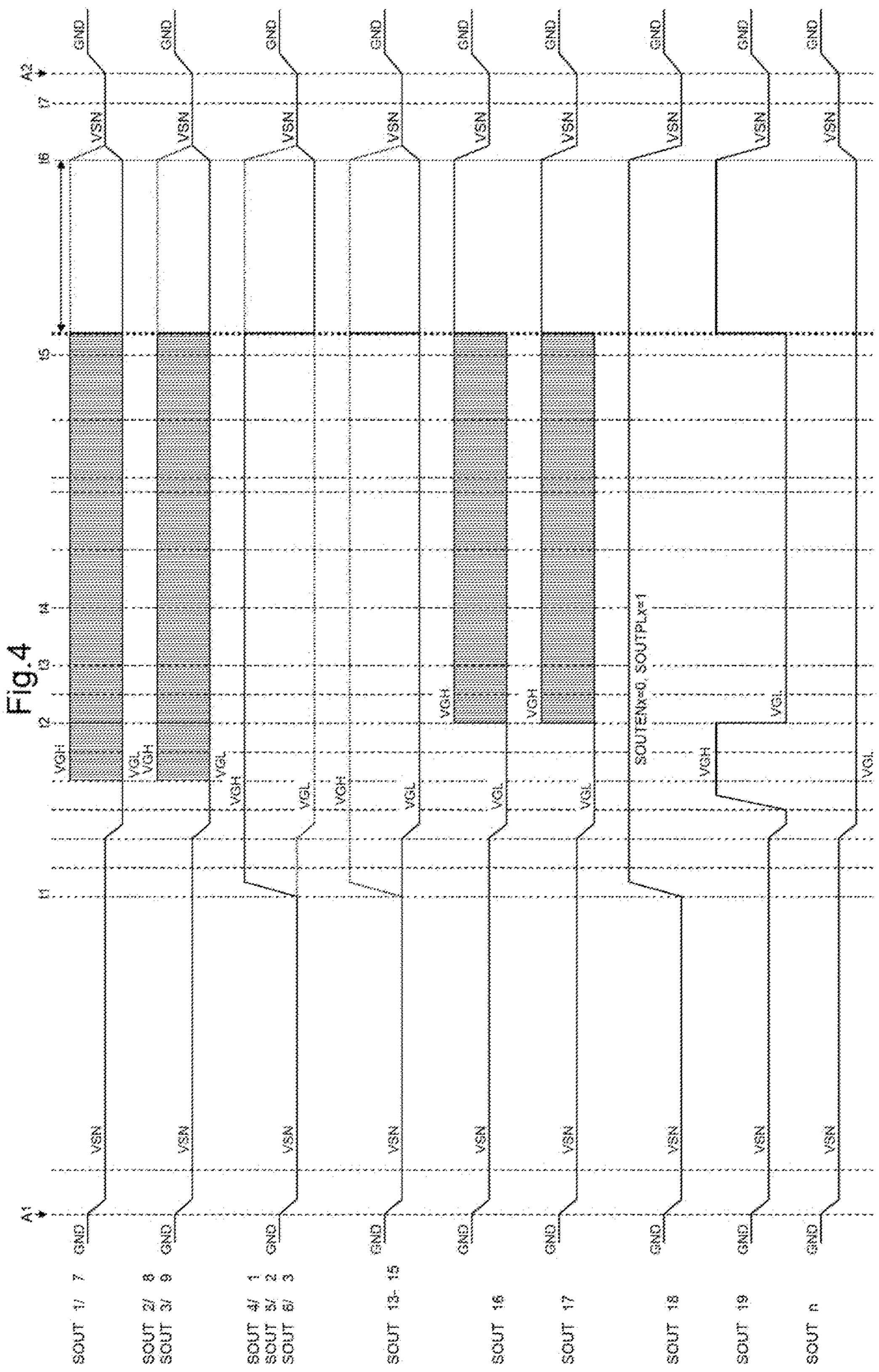
FIG. 4 is a timing diagram showing an extension of FIG. 3 in a range defined by the lines of A1 and A3 therein.
Figure 5:
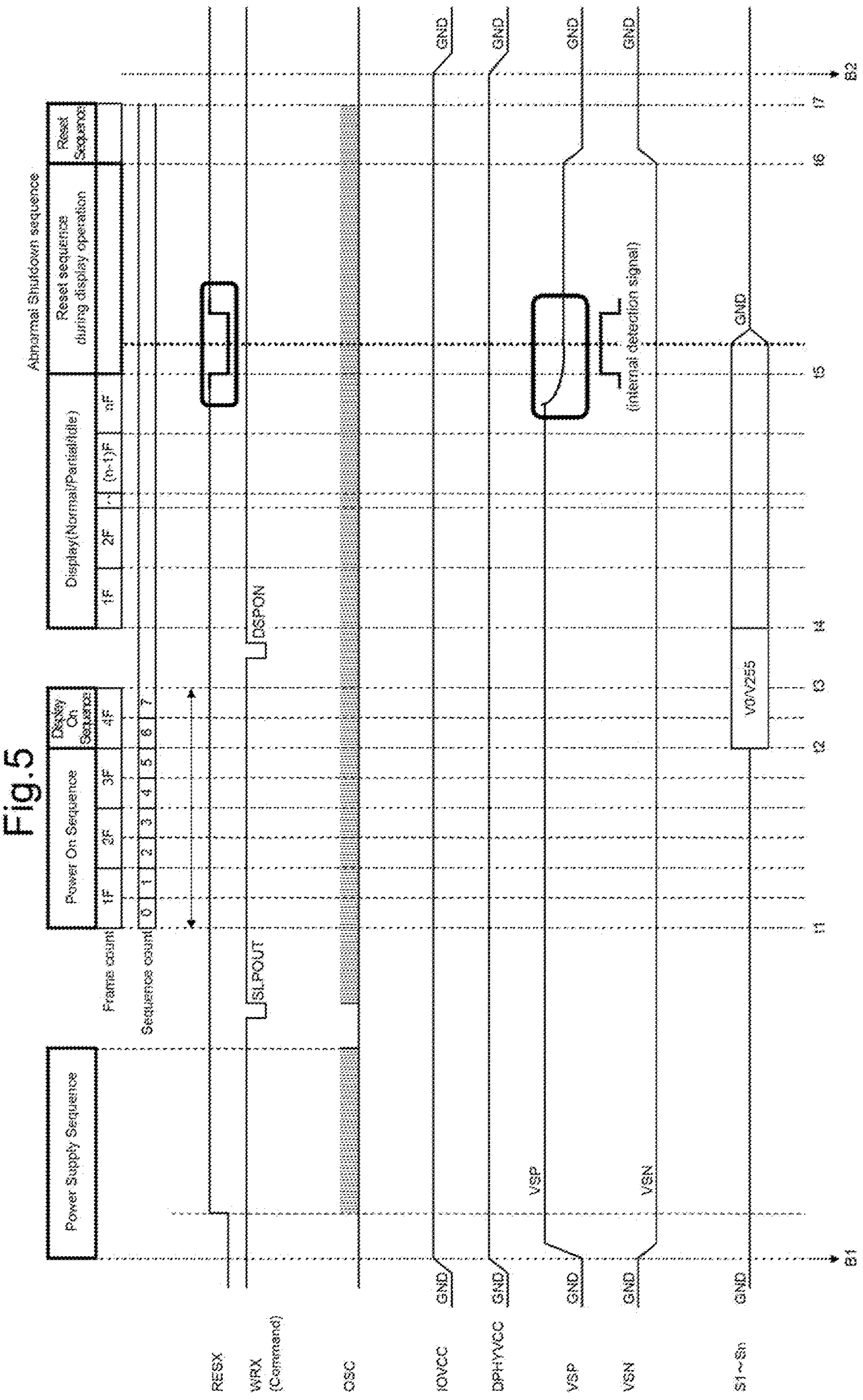
FIG. 5 is a timing diagram showing the second embodiment of the display operation timing in a case where the abnormal shutdown process interrupts a display operation.
Figure 6:
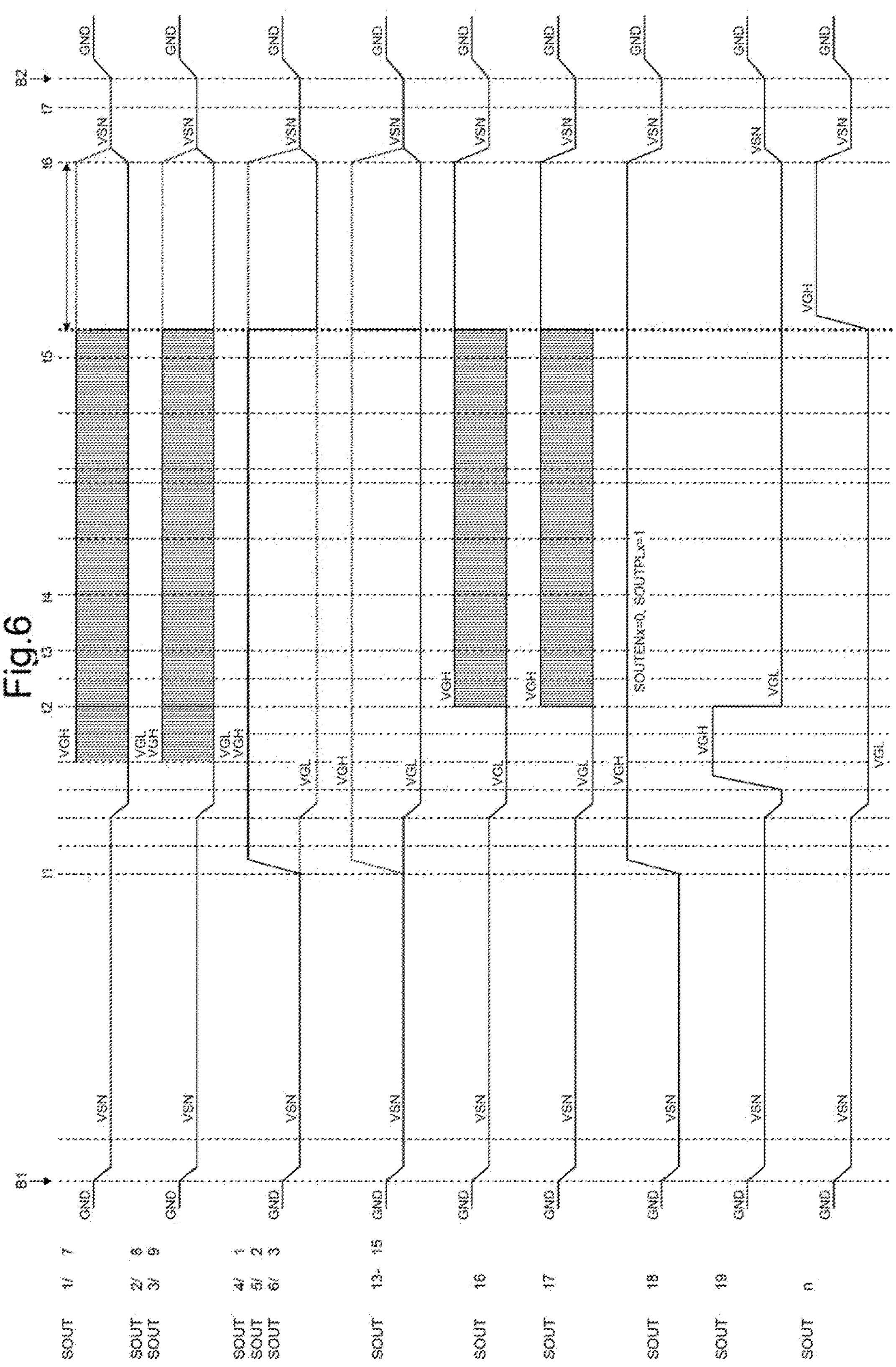
FIG. 6 is a timing diagram showing an extension of FIG. 5 in a range defined by the lines B1 and B2 therein.
Figure 7:
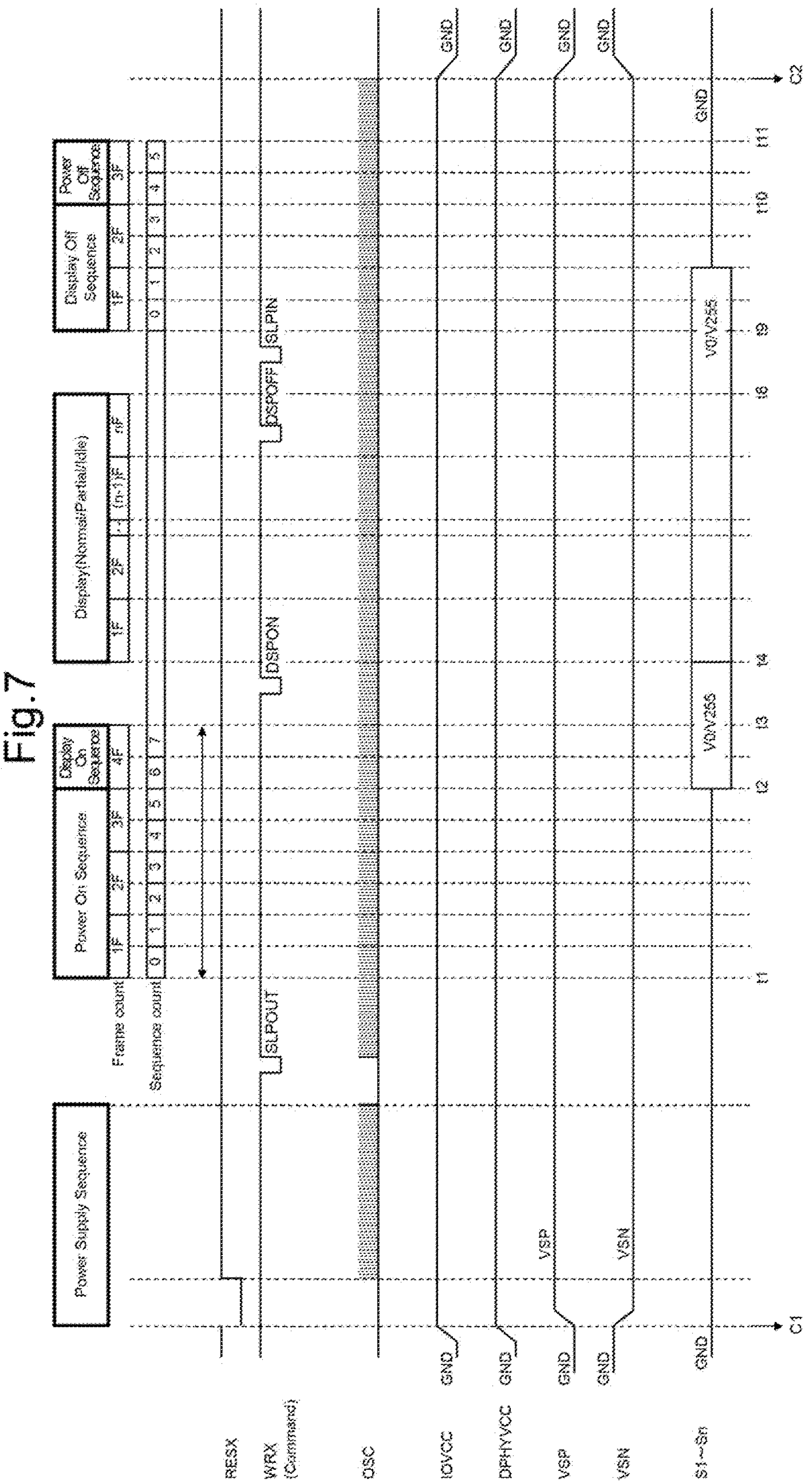
FIG. 7 is a timing diagram showing, by example, the display operation timing in a ease where no abnormal shutdown process interrupts a display operation.
Figure 8:
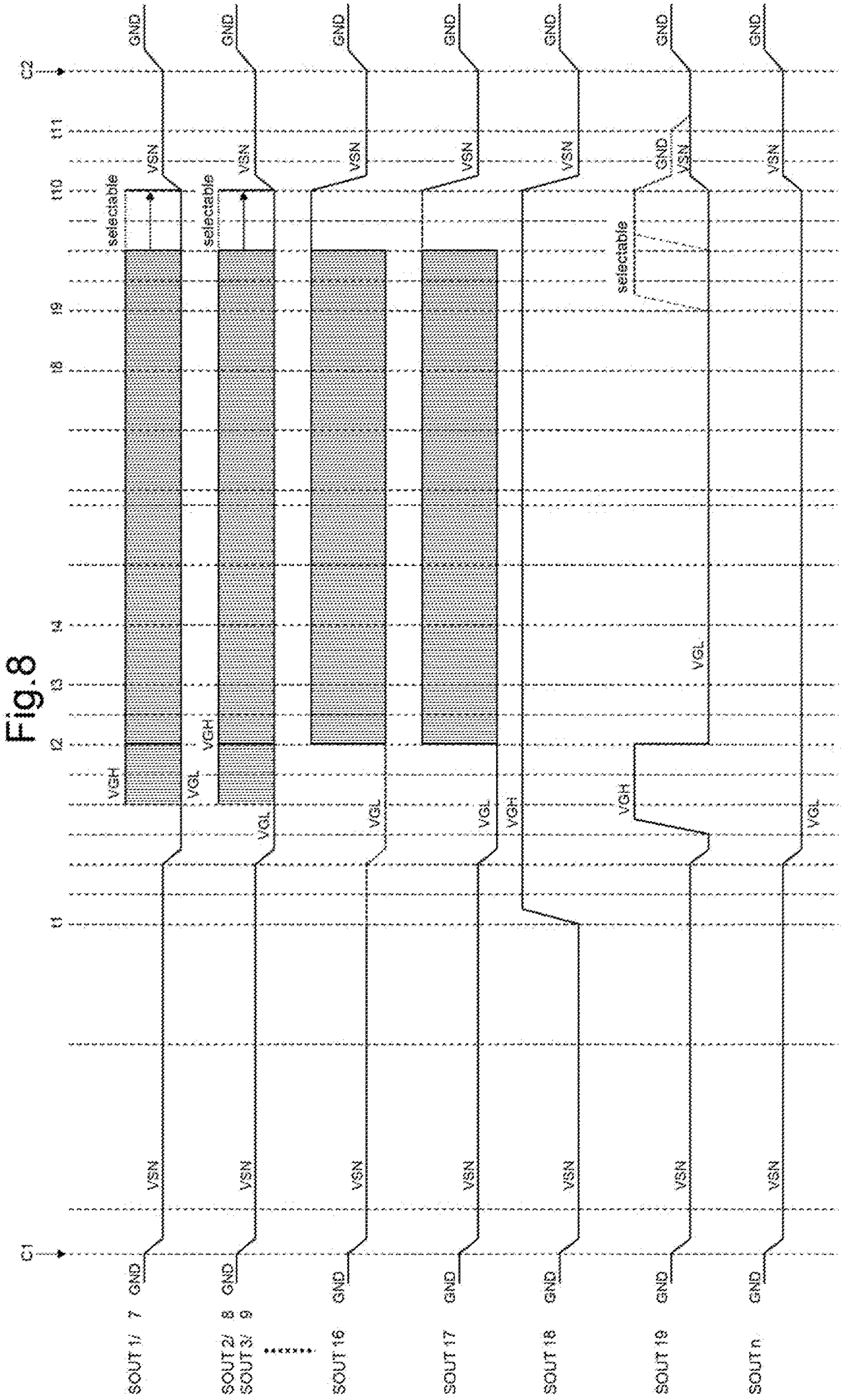
FIG. 8 is a timing diagram showing an. extension of FIG. 7 in a range defined by the lines C1 and C2 therein.

FIGS. 3 and 4 show the first embodiment of the display operation timing it a case where an abnormal shutdown process interrupts the display operation. FIGS. 5 and 6 show the second embodiment of the display operation timing in a case where an abnormal shutdown process interrupts the display operations FIGS. 7 and 8 show, by example, the display operation riming in a case where no abnormal shutdown process interrupts the display operation. In the diagrams, WRX represents a command provided from the host processor to the liquid crystal driver 1; SLPOUT represents a recovery command for recovery from Sleep to an operable state; DSPON represents a display-start command, DSPOFF represents a display-end command, and SLPIN represents a sleep command.

In the diagrams, the time from t1 to t2 is a period for an operation according to a power-on sequence in response to the recovery command SLPOUT, and the time from t2 to t3 is a period for a display-setup operation subsequent thereto. In FIGS. 7 and 8, the time; from t4 to t8 is a display-operation period in response to. the display-start command DSPON; no request for power supply cutoff nor request for reset is made until the display-end command DSPOFF is issued. In this case, in response to the sleep command SLPIN, the timing signals SOUT1 to SOUTn are regulated in polarity by the timing signals TS1 to TSn according to an end-of-display sequence in the time from t9 to t10, thereby preventing undesired charge from remaining on display pixels of the liquid crystal display panel. In the tires from t10 to t11 subsequent to it, supplies of external power supplies IOVCC, DPHYVCC, VSP and VSN from an external power-supply circuit are stopped to complete a normal power supply cutoff according to a power-off sequence.

However, in the embodiment of FIGS. 3 and 4, at the time t5 during a display-operation period, a reset instruction is provided, according to a reset signal RESX, or an external power supply VSP is cut off undesirably. These diagrams are presented as if a reset instruction and power supply cutoff take place in parallel, which stay be regarded here as at least one of them arises. In addition, if is supposed that the power supply VSP is cut off, which is just one example. The power supply to be out off may be any power supply and of course, ail the power supplies may be cut off. A capacitor such as a bypass capacitor is disposed for each of the external power supplies IOVCC, DPHYVCC, VSP and VSN; the liquid crystal driver 1 is arranged so that a predetermined circuit operation is allowed for just a short time by use of an electric charge accumulated by such capacitor at occurrence of power supply cutoff.

The abnormality detection circuit 3 detects a reset instruction according to a reset signal RESX, or the cutoff of the external power supply Curing a display-operation period and thus, a reset sequence such as an abnormal shutdown process is executed from the time t5 to t6, whereby the selection by the selectors 32_1 to 32_n is switched, and the timing signals SOUT1 to SOUTn are regulated in polarity by values set on the polarity-set register 15 instead of timing signals TS1 to TSn. Consequently, it is avoided that an undesired charge remains on a display pixel of the liquid crystal display panel. On the other hand, the occurrence of the power supply-cutoff during display operation makes an internal circuit operation unstable, which makes impossible to execute a normal power supply cutoff sequence, and to gain a required operation voltage. Likewise, a reset instruction darning display operation causes the initialization of an internal circuit and therefore, the liquid crystal driver 1 does not go through a sequence for ending the display operation, and it becomes impossible to obtain a required operation voltage. As a result, the polarities of timing signals SOUT1 to SOUTn are caused to deviate from regulated ones, leading to the degradation of the liquid crystal display panel.

Then, the power supply cutoff and the reset instruction at that time are detected outside the liquid crystal driver 1 as well. Therefore, for example, in the period from the time t6 to t7, supplies of external, power supplies IOVCC, DPHYVCC, VSP and VSN from external power-supply circuits are stopped to complete the cutoff of all the power supplies. The operation of cutting off all the power supplies is performed by execution of the reset sequence in the period from the time t6 to t7, which is not particularly shown in the diagram. This is just one example, in which the same process as that in a power-on sequence may he performed, or the host processor stay perform another exceptional process.

The embodiment of FIGS. 5 and 6 is different from that of FIGS. 3 and 4 in the timings with which the polarities of the timing signals SOUT1 to SOUTn regulated in the reset sequence in the period from the time t5 to t6 are changed. The embodiments are identical to each other in other points.

The above embodiments bring about the effect and advantage as described below.

Figure 9:
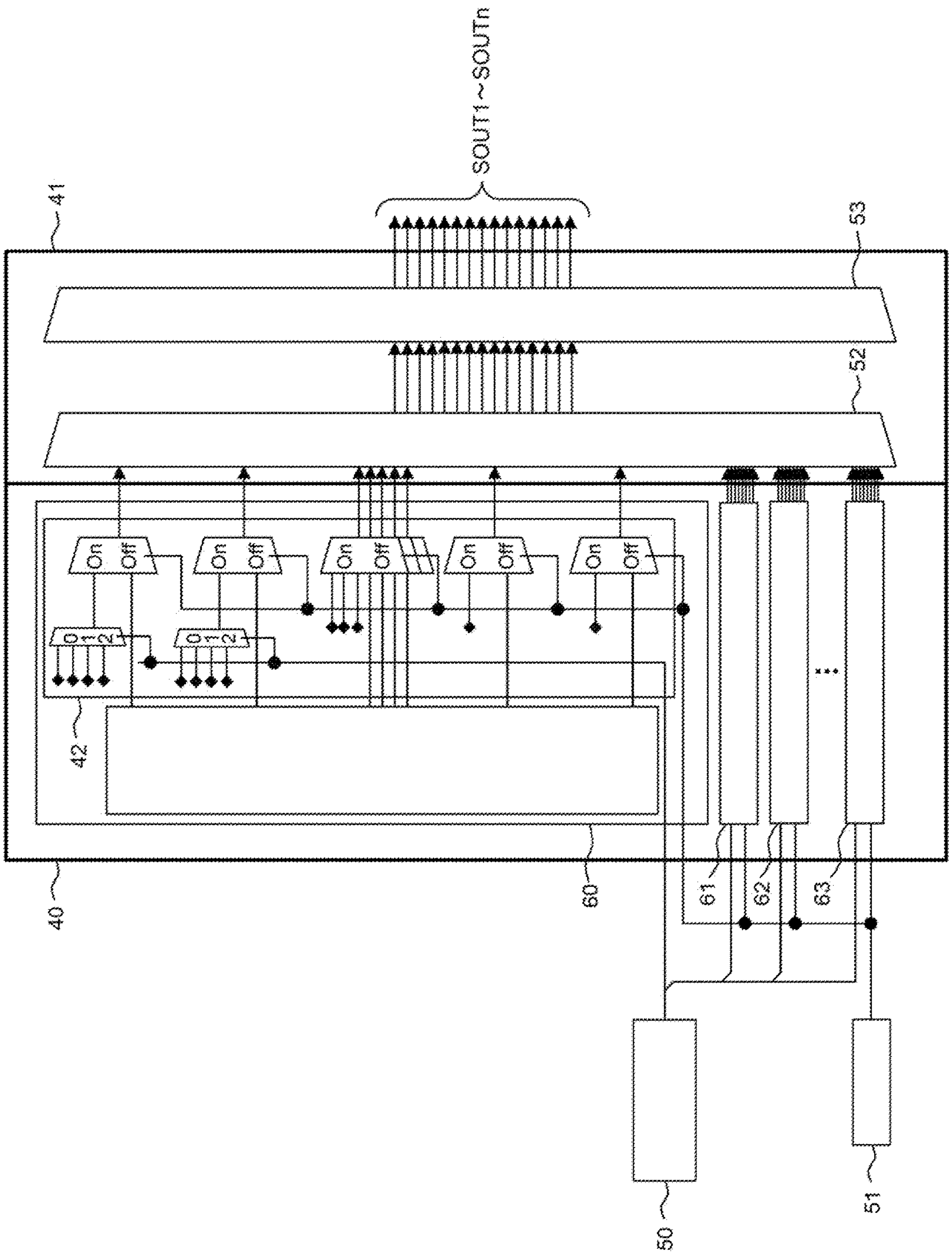
FIG. 9 is a block diagram of a comparative example showing, by example, a circuit arrangement of a timing control circuit and a panel interface circuit which was studied prior to the invention.

A liquid crystal display panel varies in its control timing or control wavelength depending on the manufacturer and product type of the liquid crystal display panel. Therefore, the timing control circuit 4 has, as the second timing generation logic 4B, a plurality of timing generators 20 to 23 capable of forming timing signals adaptive to liquid crystal display panels of manufacturers which are expected to be used in advance, and it is arranged to he able to cope with liquid crystal display panels by selecting and using any of the plurality of timing generators. In this case, the polarities of timing signals SOUT1 to SOUTn regulated in an abnormal shutdown process will vary depending on which of the timing generators 20 to 23 is selected and used. The liquid crystal driver 1 copes with this by means of setting the polarities of timing signals SOUT1 to SOUTn regulated in the abnormal shutdown process on the polarity-set register 15 in units of bits. The host processor can set data on the polarity-set register 15 in a programmable method. FIG. 9 shows, by example, a circuit arrangement of a timing control circuit 40 and a panel interface circuit 41 which was examined prior to the invention. The second select circuit 32 is disposed in the final stage for outputting timing signals SOUT1 to SOUTn in the embodiment of FIG. 2, whereas in the example of FIG. 9, select circuits 42 are provided instead thereof, whereby outputs of corresponding liming generators 60 to 63 can be changed in polarity respectively. The timing generator 60 of FIG. 9 has the timing generator 20 and the select circuit 42 as shown in FIG. 2. In the case of FIG. 9, the polarities of timing signals can be selected by selecting input nodes connected to a power supply or the ground by use of a register 50. Unlike the embodiment of FIG. 2, it is not completely possible to program the polarities of timing signals in units of bits by use of register values. The reference numeral 51 denotes an abnormality detection circuit which is the same as the abnormality detection circuit 13; the numeral 52 denotes a select circuit which selects outputs of the timing generators 60 to 63; and the numeral 53 denotes a circuit which changes the array of outputs of the select circuit 52.

The differences between FIGS. 2 and 3 in circuit arrangement are as follows. The first is the extent to which the select circuit of FIG. 9 is made programmable is lower than that in the embodiment of FIG. 2. The second is that the functions of the select circuits 42 provided for the timing generators 60 to 63 respectively in the case of FIG. 3 are unified into the final stage for output ting timing signals SOUT1 to SOUTn in the embodiment of FIG. 2. The second difference brings about not only the effect of reducing the circuit scale, but also the peculiar effect as described below. There is a tendency for an abnormal shutdown sequence to change depending on not only manufacturers of liquid crystal display panels, but also what products the liquid crystal display panels are commercialized into because of sophistication and diversification of the liquid crystal display panels. Under circumstances in which the number of timing generators to incorporate in is already large, the unification of select circuits provided for timing generators respectively can largely contribute to the reduction in circuit scale. Turning to the first difference, unlike the circuit arrangement of FIG. 9, timing signals SOUT1 to SOUTn can be changed in polarity freely in units of bits according to the embodiment of FIG. 2. Therefore, even if the specifications concerning the polarities of riming signals SOUT1 to SOUTn to he regulated by the abnormal shutdown sequence are changed, the semi conductor device according to the embodiment of FIG. 2 can readily adapt to ouch change. In addition, the steps for device test and the steps for logic verification are both reduced and therefore, it contributes to the cost cutting in that connection as well. Further, the abnormal shutdown process is also applied in response to a reset instruction during a display period. Therefore, it is possible to prevent a reset instruction accidentally issued owing to noise or the like during display operation from causing an undesired stress such as a voltage to act on the liquid crystal display panel as described above.

The invention is not limited to the above embodiments. It is obvious that various changes and modifications may be made without departing from the subject matter thereof.

For instance, the semiconductor device is not limited to a liquid crystal driver. It may be an semiconductor device arranged by providing a liquid crystal driver and a host processor on one chip, a semiconductor device arranged by providing a liquid crystal driver, a host processor and a touch panel sensor on one chip, or a semiconductor device arranged by integrating a communication device arid otter circuits.

The above embodiment is arranged aiming at preventing the degradation of characteristics of a liquid crystal display panel not having an intelligent function for countering a power supply cutoff in a case where the control of a drive voltage of the liquid crystal display panel is interrupted without going through a predetermined termination sequence. The invention hereof is also applicable to a technical field having commonality from this point of view. For instance, it can be applied to an abnormal shutdown process in a case where the driving of a synchronous motor is stopped oat of a normal shutdown sequence.

The display panel is not limited to a liquid crystal display panel. It may be a plasma or electroluminescent display panel.

What is claimed is:

1. A semiconductor device for forming drive signals and outputting the drive signals in parallel, the semiconductor device comprising:

a plurality of timing generators each configured to output timing signals for operating at least a respective one of a predefined plurality of display panel types, at least one timing generator of the plurality of timing generators configured to output timing signals of more than one bit according to a predetermined sequence;

a first select circuit configured to select, from the timing signals output by the plurality of timing generators, and based on manufacturer information indicating at least one of the predefined plurality of display panel types, first timing signals output by a first timing generator of the plurality of timing generators;

a second select circuit configured to output a selected one of the first timing signals and polarity-regulated signals;

a control register configured to set, polarities of each of the polarity-regulated signals individually; and a detection circuit configured to detect an abnormal power supply cutoff of the semiconductor device, wherein the second select circuit is configured to, in response to detection of an abnormal power supply cutoff by the detection circuit, switch from a first state of selecting the first timing signals to a second state of selecting the polarity-regulated signals, and wherein the drive signals are configured to drive a display panel in units of display frames, and wherein the timing signals are display timing signals of the display panel.

2. The semiconductor device according to claim 1, wherein the abnormal power supply cutoff is an abnormal drop in source voltage as a deviation from a power supply cutoff sequence occurs.

3. The semiconductor device according to claim 1, wherein the detection circuit is configured to detect the abnormal power supply cutoff upon detecting a reset instruction during an operation period for outputting the drive signals outward.

4. The semiconductor device according to claim 1, further comprising a host interface circuit configured to provide access to the control register from outside the semiconductor device.

5. A semiconductor device comprising:

a timing control part comprising a plurality of timing generators each configured to output timing signals for operating at least a respective one of a predefined plurality of display panel types, at least one timing generator of the plurality of timing generators configured to output timing signals of more than one bit; and a drive control part configured to output drive signals in synchronization with the timing control part, wherein the drive signals are configured to drive a display panel in units of display frames, and wherein the timing signals are display timing signals of the display panel, wherein the timing control part includes:

a first select circuit configured to select, from the timing signals output by the plurality of timing generators, and based on manufacturer information indicating at least one of the predetermined plurality of display panel types, first timing signals output by a first timing generator of the plurality of timing generators, a second select circuit configured to output a selected one of the first timing signals and polarity-regulated signals, a control register configured to set polarities of each of the polarity-regulated signals individually, and a detection circuit configured to detect a predetermined abnormal condition during an operation period of the drive control part for outputting the drive signals, wherein the second select circuit is configured to, in response to detection of the abnormal condition by the detection circuit, switch from a first state of selecting the first timing signals to a second state of selecting the polarity-regulated signals.

6. The semiconductor device according to claim 5, wherein the predetermined abnormal condition comprises an abnormal fluctuation in source voltage.

7. The semiconductor device according to claim 5, wherein the predetermined abnormal condition comprises a condition in which a reset instruction is accepted at an external-reset terminal of the semiconductor device.

8. The semiconductor device according to claim 5, further comprising a host interface circuit configured to provide access to the control register from outside the semiconductor device.

9. A method comprising:

outputting, using a plurality of timing generators of a timing control part, timing signals of more than one bit, wherein each timing generator of the plurality of timing generators is configured to output timing signals for operating at least a respective one of a predefined plurality of display panel types;

forming, using a drive control part, drive signals in synchronization with the timing control part, wherein the drive signals are configured to drive a display panel in units of display frames, and wherein the timing signals are display timing signals of the display panel;

selecting, from the timing signals output by the plurality of timing generators, and based on manufacturer information indicating at least one of the predetermined plurality of display panel types, first timing signals formed by a first timing generator of the plurality of timing generators;

outputting a selected one of the first timing signals and polarity-regulated signals;

individually setting, based on control data in a control register, polarities of each of the polarity-regulated signals; and detecting a predetermined abnormal condition during an operation period of the drive control part for outputting the drive signals, wherein outputting a selected one of the first timing signals and polarity-regulated signals is responsive to detecting the predetermined abnormal condition.

10. The method according to claim 9, wherein the predetermined abnormal condition comprises an abnormal fluctuation in source voltage.

11. The method according to claim 9, wherein the predetermined abnormal condition comprises a condition in which a reset instruction is accepted at an external-reset terminal of a semiconductor device that includes the timing control part and the drive control part.

12. The method according to claim 9, wherein the timing control part and drive control part are included within a semiconductor device, the method further comprising:

providing access to the control register from outside the semiconductor device.

* * * * *